United States Patent
Fukada

(10) Patent No.: US 9,110,109 B2
(45) Date of Patent: Aug. 18, 2015

(54) POTENTIAL MEASURING DEVICE

(71) Applicant: KOGANEI CORPORATION, Koganei-shi, Tokyo (JP)

(72) Inventor: Yoshinari Fukada, Koganei (JP)

(73) Assignee: KOGANEI CORPORATION (JP)

(*) Notice: Subject to any disclaimer, the term of this patent is extended or adjusted under 35 U.S.C. 154(b) by 323 days.

(21) Appl. No.: 13/867,421

(22) Filed: Apr. 22, 2013

(65) Prior Publication Data

US 2013/0307554 A1  Nov. 21, 2013

(30) Foreign Application Priority Data

Apr. 23, 2012  (JP) ................... 2012-098097

(51) Int. Cl.
*G01R 29/12* (2006.01)

(52) U.S. Cl.
CPC ..................... *G01R 29/12* (2013.01)

(58) Field of Classification Search
CPC ..................................................... G01R 29/12
USPC .......... 324/458, 754.23, 754.22, 762.03, 251, 324/175; 382/132, 145; 430/30, 494
See application file for complete search history.

(56) References Cited

U.S. PATENT DOCUMENTS 6,177,800 B1*   1/2001  Kubby et al. ................. 324/458
2013/0307553 A1*  11/2013  Fukada et al. ................ 324/458

FOREIGN PATENT DOCUMENTS

JP    10-115647 A    5/1998
JP    2010-166685 A  7/2010

* cited by examiner

*Primary Examiner* — Arleen M Vazquez
*Assistant Examiner* — Robert P Alejnikov, Jr.
(74) *Attorney, Agent, or Firm* — Cantor Colburn LLP

(57) ABSTRACT

A potential measuring device which measures a charged object in a non-contact manner with a sensor may include a first shutter having a first shutter part, which is provided with a first opening which can be positioned at a position opposing the sensor, and leaf spring parts extending from both ends thereof; a second shutter having a second shutter part, which is provided with a second opening which can be positioned at a position opposing the sensor and the first opening, and leaf spring parts extending from both ends thereof; a coil provided so that a direction along a center axis opposes portions of the leaf spring parts; and a magnet provided on each of regions opposing both end sides of the coil in the leaf spring parts extending from the both ends of each of the first shutter part and the second shutter part.

6 Claims, 16 Drawing Sheets

POTENTIAL MEASURING DEVICE

CROSS REFERENCE TO RELATED APPLICATIONS

The present invention claims priority under 35 U.S.C. §119 to Japanese Application No. 2012-098097 filed Apr. 23, 2012, the entire content of which is incorporated herein by reference.

BACKGROUND OF THE INVENTION

1. Field of the Invention

The present invention relates to a potential measuring device which measures a surface potential of a charged object in a non-contact manner.

2. Description of the Related Art

Various types of devices have been developed as a potential measuring device which measures a surface potential in a non-contact manner For example, a surface potential sensor (see Patent Document 1) is known. A piezoelectric driving element is used for driving this surface potential sensor. In Patent Document 2, a linear actuator is described as a structure for driving a driven region. In structures driving driven parts using a coil, which are described in these Patent Document 1 and Patent Document 2, a magnet (permanent magnet) and a back yoke are provided in a state of opposing a coil (electromagnet) on one end side of the coil. Thus, when an electric current is conducted through the coil, it is possible to drive a driver in a direction orthogonal to a lining direction of the coil and the magnet.

[Patent Document 1] Japanese Patent Application Laid-open No. H10-115647

[Patent Document 2] Japanese Patent Application Laid-open No. 2010-166685

However, in the potential measuring device of Patent Document 1, a vibrating piece vibrates in a direction (width direction) orthogonal to its extending direction, and thus a displacement amount of the vibrating piece is small. Further, in the structure described in Patent Document 2, the magnet and the back yoke are disposed only on one end side of the coil. Thus, magnetic efficiency thereof is not good, and therefore a driving force obtained by a magnetic force generated in the coil is weak.

The subject matter of the present application is made in view of the above-described situation, and at least an embodiment provides a potential measuring device of non-contact type having better magnetic efficiency than conventional potential measuring devices.

SUMMARY OF THE INVENTION

To solve the above-described problem, according to a first aspect of the present invention, there is provided a potential measuring device which measures a surface potential of a charged object in a non-contact manner with a sensor disposed to oppose the charged object, the device including: a first shutter having a first shutter part, which is disposed between the charged object and the sensor and has a first opening, and leaf spring parts extending from both ends of the first shutter part; a second shutter having a second shutter part, which is disposed between the charged object and the sensor and is provided with a second opening disposed at a position opposing the first opening, and leaf spring parts extending from both ends of the second shutter part; a coil having a yoke in which magnetic poles different from each other are formed on one end side and another end side when an electric current is conducted, and the one end side and the other end side are provided to oppose portions of the leaf spring parts; and a magnet provided to oppose the coil on each of the leaf spring parts of at least one of the first shutter and the second shutter.

Further, in the above-described invention, it may be structured such that the first shutter and the second shutter are disposed in a state of lining along a forward and backward direction orthogonal to a direction coupling the one end side and the other end side of the coil, in the first shutter part a projecting portion exists to project toward the second shutter side in the forward and backward direction more than the leaf spring parts, with the first opening being provided to reach the projecting portion, and in the second shutter part a projecting portion exists to project toward the first shutter side in the forward and backward direction more than the leaf spring parts, with the second opening being provided to reach the projecting portion.

Further, in the above-described invention, it may be structured such that the sensor is attached to a first base plate on a side closer to the first opening and the second opening than the coil, and a driving circuit for driving the coil is provided on a second base plate on a side separated farther from the first opening and the second opening than the coil.

Further, in the above-described invention, it may be structured such that the magnet is attached to a side of each of the leaf spring parts that is separated from the shutter part farther than a center side of the leaf spring part.

Further, in the above-described invention, it may be structured such that the yoke is provided along a direction coupling the one end side and the other end side of the coil, and a back yoke guiding a magnetic flux is provided on an opposite side of a side of the magnet that opposes the leaf spring part.

Further, according to a second aspect of the present invention, there is provided a potential measuring device which measures a surface potential of a charged object in a non-contact manner with a sensor disposed to oppose the charged object, the device including: a first shutter having a first shutter part, which is disposed between the charged object and the sensor and has a first opening, and leaf spring parts extending from both ends of the first shutter part; a second shutter having a second shutter part, which is disposed between the charged object and the sensor and is provided with a second opening disposed at a position opposing the first opening, and leaf spring parts extending from both ends of the second shutter part; a coil having an in-coil yoke in which magnetic poles different from each other are formed on one end side and another end side when an electric current is conducted, and the one end side and the other end side are provided to oppose portions of the leaf spring parts; and a magnet provided to oppose the coil on each of the leaf spring parts of at least one of the first shutter and the second shutter, wherein the magnetic flux of the magnet flows in one direction through the in-coil yoke and the yoke outside the coil, and by an excitation current of the coil, a coil magnetic flux is generated alternately in a forward direction and a reverse direction with respect to the magnetic flux.

According to the present invention, good magnetic efficiency can be obtained in a potential measuring device of non-contact type.

DETAILED DESCRIPTION OF THE PREFERRED EMBODIMENTS

First Embodiment

Hereinafter, a potential measuring device 10A according to a first embodiment of the present invention will be described based on the drawings. Note that in the following description, there may be cases where an XYZ orthogonal coordinate system is set for description. In this coordinate system, a direction in which shutter parts 44, 54 vibrate is defined as an X direction, a direction in which a first shutter 40A and a second shutter 50A line (forward and backward direction) is defined as a Y direction, and a direction orthogonal to these X direction and Y direction (direction from a base part 21 toward a sensor electrode 60; upward and downward direction) is defined as a Z direction.

<Regarding Structure of the Potential Measuring Device 10A>

Figure 1:
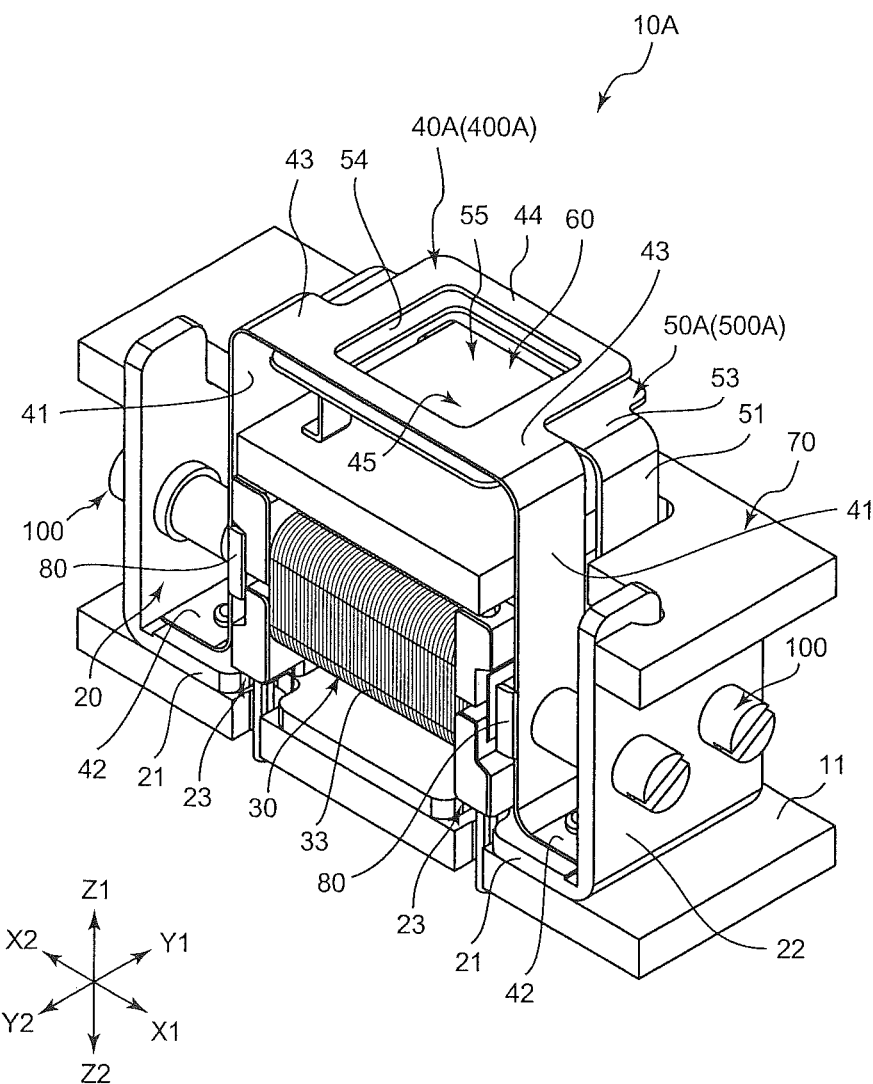
FIG. 1 is a perspective view illustrating a structure of a potential measuring device according to a first embodiment of the present invention.
Figure 2:
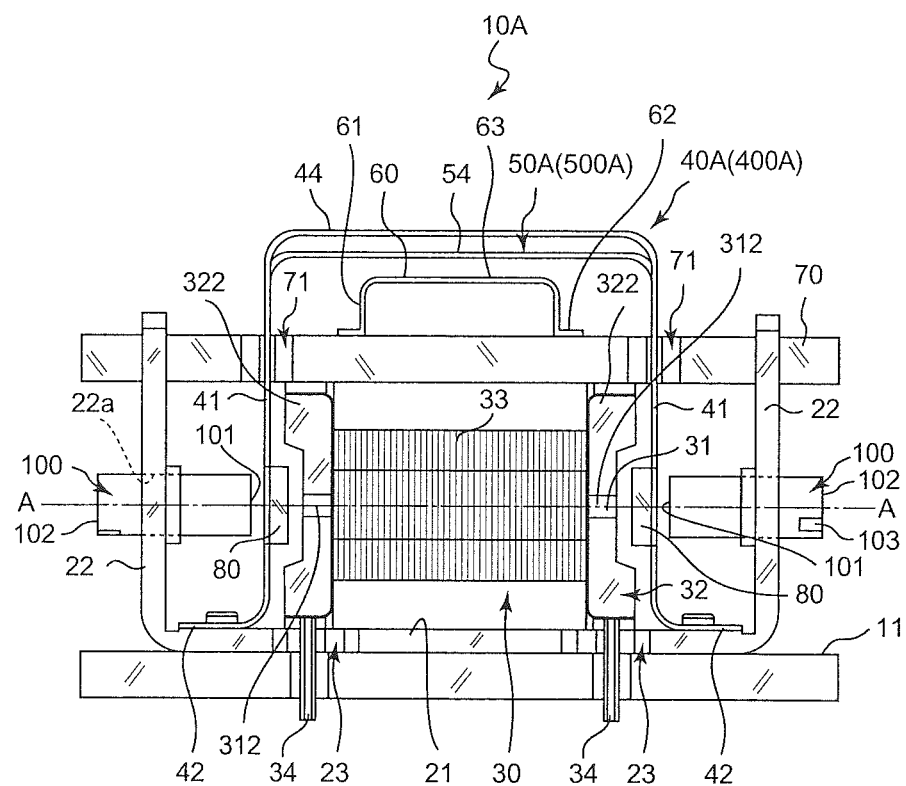
FIG. 2 is a side view of the potential measuring device of FIG. 1.
Figure 2:
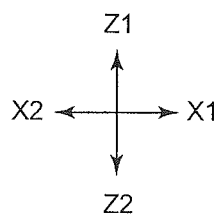
Figure 3:
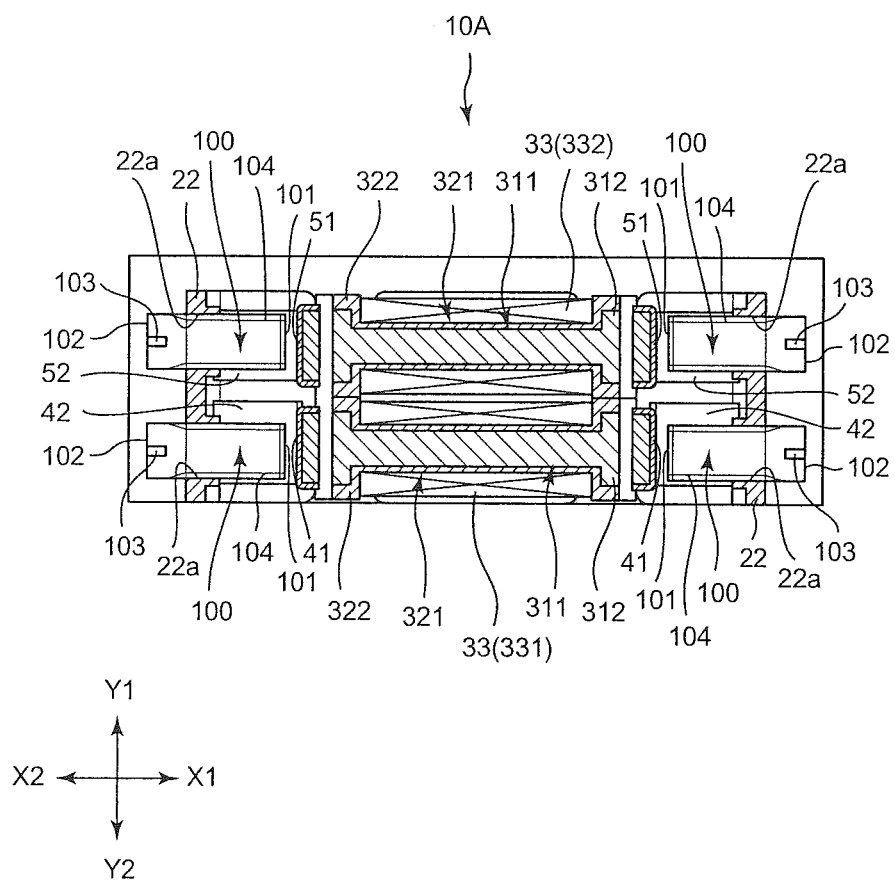
FIG. 3 is a cross-sectional view illustrating a state of cutting the potential measuring device along an A-A line of FIG. 2.

FIG. 1 is a perspective view illustrating a structure of the potential measuring device 10A. FIG. 2 is a side view of the potential measuring device 10A. FIG. 3 is a cross-sectional view illustrating the potential measuring device 10A taken along an A-A line of FIG. 2.

The potential measuring device 10A has one frame member 20, two coil units 30, one first shutter 40A, one second shutter 50A, one sensor electrode 60, four magnets 80, and four back yokes 100. In the potential measuring device 10A, as will be described later, by using the coil units 30 to drive the first shutter 40A and the second shutter 50A, for example, electric flux lines based on a surface potential of a not-illustrated measured object which is disposed opposing the first shutter 40A and the second shutter 50A are cut, and an alternating voltage in proportion to the surface potential of the measured object is induced in the sensor electrode 60. This alternating voltage is converted into a low-impedance signal using a not-illustrated current amplifying circuit or the like, and thereafter conducted to the outside as a detection signal representing the surface potential of the measured object.

Respective parts constituting the potential measuring device 10A will be described.

The frame member 20 has a U-shaped structure having a base part 21 and rising parts 22, in which the rising parts 22 extend in a Z direction from both end sides of the base part 21. The base part 21 is attached to a driving base plate 11. Although details will be described later, the coil units 30, the first shutter 40A, and the second shutter 50A are attached to the base part 21, and the back yokes 100 are attached to the rising parts 22.

Cutouts 23 are provided in the base part 21. The cutouts 23 are a part in which a binding pin 34 for binding an end of a winding wire of the coil 33 is positioned. Note that the number of cutouts 23 provided corresponds to the number of ends of winding wires of the coil 33.

The frame member 20 is formed of a metal thicker than the first shutter 40A and the second shutter 50A, so as to have strength of the degree that it would not bend easily when electricity is conducted through a coil 33, which will be described later. Note that while a metal that is a magnetic body is most suitable as the material of the frame member 20, an SU304 nonmagnetic metal for example may be used as the material, or any other non-metallic material such as ceramic or resin may be used as the material. Further, the frame member 20 corresponds to a second base plate.

Figure 4:
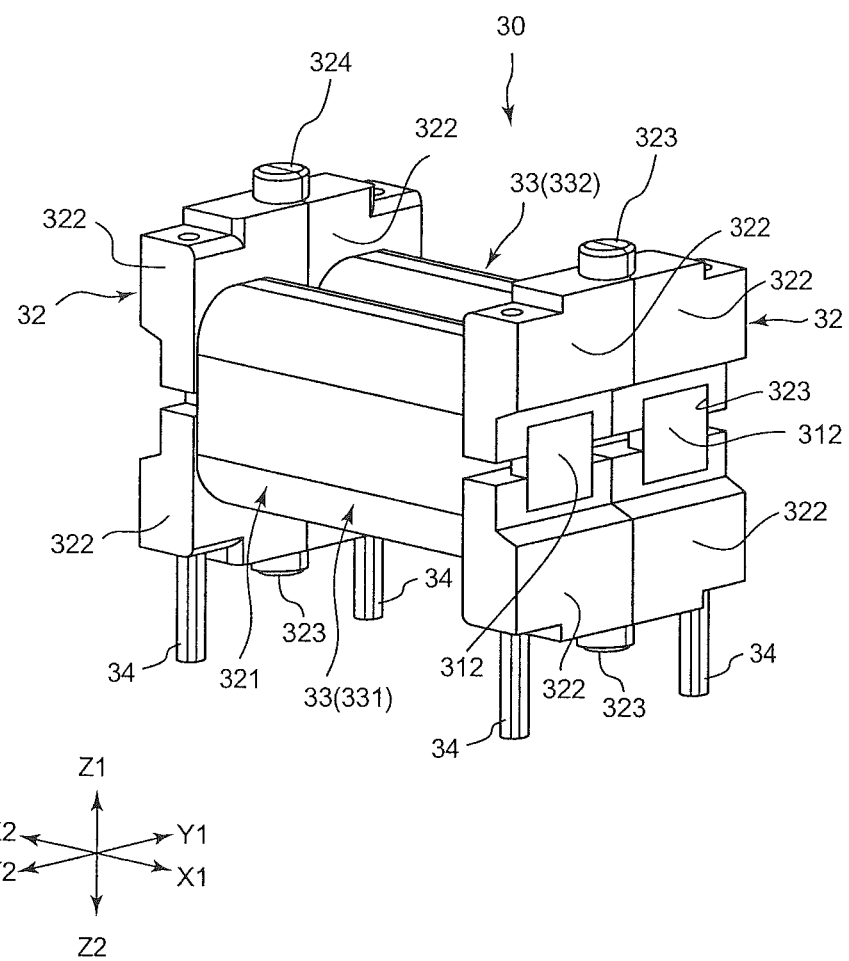
FIG. 4 is a perspective view illustrating a structure of a coil unit in the potential measuring device of FIG. 1 in a state that two coil units are disposed adjacently.
Figure 5:
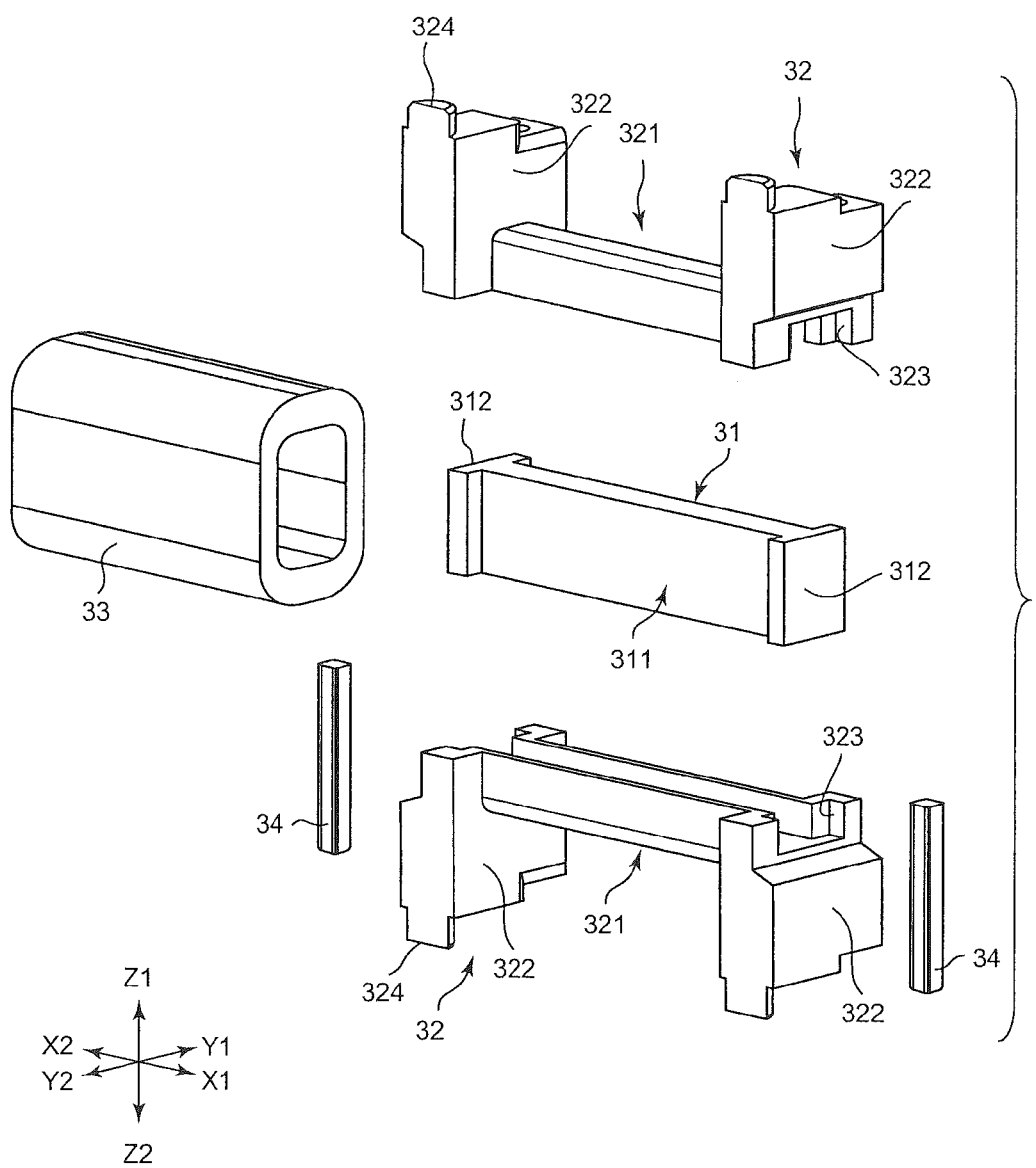
FIG. 5 is an exploded perspective view illustrating the structure of the coil units in the potential measuring device of FIG. 1.

FIG. 4 is a view illustrating an appearance of the two coil units 30. FIG. 5 is an exploded view illustrating an internal structure of the coil units. The two coil units are disposed adjacent to each other in a width direction (Y direction) of the driving base plate 11.

As illustrated in FIG. 4 and FIG. 5, each coil unit 30 has a yoke 31, a bobbin 32, a coil 33, and a binding pin 34. The yoke 31 allows concentrating a magnetic flux therein, and is made of, for example, a soft magnetic material such as iron-based material, soft ferrite, sendust, permalloy, or the like. The yoke 31 is provided with a winding part 311 and yoke flange parts 312. The yoke flange parts 312 are a part opposing a magnet 80, which will be described later. The cross-sectional areas of the yoke flange parts 312 are larger than the cross-sectional area of the winding part 311. Further, the winding part 311 is a part of the yoke 31 on which the coil 33 is disposed via a winding frame part 321 of the bobbin 32.

The bobbin 32 is formed of, for example, a nonmagnetic material such as a resin. In the structure illustrated in FIG. 5, the bobbin 32 is divided into two members, and these two members have a structure to engage with each other to cover the winding part 311 of the yoke 31, exposing the yoke flange parts 312 on both sides.

As illustrated in FIG. 5, the bobbin 32 has a winding frame part 321 and bobbin flange parts 322. The winding frame part 321 is a part covering the winding part 311 of the yoke 31 (corresponding to an in-coil yoke). In a bobbin flange part 322, in a region where a yoke flange part 312 of the yoke 31 is to be inserted, a cutout 323 is provided by cutting out the bobbin flange part 322 so as to expose the yoke flange part 312 to the outside. The cross-sectional area of the bobbin flange part 322 is larger than that of the winding frame part 321.

The coil 33 is wound on the winding frame part 321 in a state that the two members of the bobbin 32 are engaged with each other so that the bobbin 32 covers the winding part 311 of the yoke 31 and the yoke flange parts 312 are exposed on the both sides. An end of the winding wire of this coil 33 is bound on the binding pin 34 in a state that an insulating coating of a winding wire surface is removed.

The coil 33 is structured by winding a winding wire (omitted from illustration) predetermined times on the winding frame part 321 of the bobbin 32. Thus, magnetic poles are formed on both end sides of the coil 33 when an electric current is conducted through the coil 33, and these magnetic poles are also formed on the yoke flange parts 312 of the yoke 31.

The binding pin 34 is a pin-shaped member positioned in a cutout 23 of the frame member 20, and is formed of, for example, a material having conductivity such as metal. The end of the winding wire is wound predetermined times on this binding pin 34, and thereafter the end and the binding pin 34 are joined in an electrically conductive state by a method such as soldering.

Note that the bobbin flange part 322 of the bobbin 32 is provided to be larger in dimension in a height direction (Z direction) than the yoke flange part 312 of the yoke 31, but the dimension is for not causing the coil 33 to contact with the base part 21 and a printed circuit board 70 when the coil 33 is wound on the winding frame part 321 of the bobbin 32.

Further, a positioning part 324 is provided on each of an upper end surface (end surface on a Z1 side) and a lower end surface (end surface on a Z2 side) of the bobbin flange part 322 of the bobbin 32. In the structure illustrated in FIG. 4 and FIG. 5, the positioning parts 324 are a projecting part, and the bobbin 32 is fixed by fitting the positioning parts 324 into positioning recess part (omitted from illustration) of the base part 21 and a positioning recess part (omitted from illustration) of the printed circuit board 70. Further, as illustrated in FIG. 4, in this embodiment, the pair of bobbins 32 is adjacent and in contact with each other, and the projecting parts of the positioning parts 324 line adjacent to a boundary portion of the contact, thereby forming one large projecting part. Further, the positioning parts 324 may be recess parts, and in this case, positioning projecting parts exist in the base part 21 and the printed circuit board 70, and the bobbin 32 is fixed by fitting of the recess parts and the positioning projecting parts.

In the structure illustrated in FIG. 5, although the bobbin 32 in each coil unit 30 can be divided in two, a structure in which it is divided into three or more may be employed, or a structure in which it is not divided may be employed.

Note that in the following description, the coil 33 operating on a first shutter system 400A (which will be described later) will be referred to as a coil 331, and the coil 33 operating on a second shutter system 500A (which will be described later) will be referred to as a coil 332, as necessary.

Next, the first shutter 40A and the second shutter 50A will be described. The first shutter 40A and the second shutter 50A are attached to the frame member 20 so as to line in, for example, the forward and backward direction (Y direction) in FIG. 1. Specifically, the first shutter 40A is located on a Y2 side, and the second shutter 50A is located on a Y1 side. The first shutter 40A and the second shutter 50A are formed of a material which excels in spring property and has conductivity. Examples of such materials include phosphor bronze, beryllium steel, SUS304, and the like, but any other metal may be used as the material.

The first shutter 40A has a pair of leaf spring parts 41, flange parts 42, an extending part 43, and a shutter part 44 (corresponding to a first shutter part). The second shutter 50A has a pair of leaf spring parts 51, flange parts 52, an extending part 53, and a shutter part 54 (corresponding to a second shutter part). The leaf spring parts 41, 51 are leg-like parts extending upward (in a direction to the Z1 side) in FIG. 1 and FIG. 2, and on its lower end side (end portion side on the Z2 side) the flange parts 42, 52 are provided. Note that in this embodiment, as illustrated in FIG. 2, the leaf spring parts 41 of the first shutter 40A are higher in the Z direction than the leaf spring parts 51 of the second shutter 50A, and the extending part 43 and the shutter part 44 of the first shutter 40A and the extending part 53 and the shutter part 54 of the second shutter 50A are provided to oppose each other without colliding against each other with a predetermined gap intervening therebetween. Further, in the X direction, as illustrated in FIG. 1 and FIG. 2, the leaf spring parts 41 of the first shutter 40A and (the yoke flange parts 312 of) the yoke 31 of the coil unit 30 located on the Y2 side oppose each other, and the leaf spring parts 51 of the second shutter 50A and the yoke flange parts 312 of the yoke 31 of the coil unit 30 located on the Y1 side oppose each other.

The flange parts 42, 52 are attached to the frame member 20. By the flange parts 42, 52, the entire first shutter 40A and second shutter 50A are fixed on the frame member 20. The extending part 43 is a part extending along the X direction on upper end sides (end portions on the Z1 side) of the leaf spring parts 41 and exists between the leaf spring parts 41 and the shutter part 44. The extending part 53 is a part extending along the X direction on upper end sides (end portions on the Z1 side) of the leaf spring parts 51 and exists between the leaf spring parts 51 and the shutter part 54.

The shutter part 44, 54 is coupled to the extending part 43, 53. A projecting portion projecting toward the Y1 side from the extending part 43 exists on the shutter part 44 of the first shutter 40A. A projecting portion projecting toward the Y2 side from the extending part 53 exists on the shutter part 54 of the second shutter 50A. Thus, in the structure illustrated in FIG. 1, each shutter part 44, 54 is provided to be wider than the other portion of the extending part 43, 53, and an opening 45, 55, which will be described later, can be positioned at a same position on an XY plane. Note that the shutter part 44, 54 may be provided to have about the same width as the other portion of the extending part 43, 53. In this case, the extending part 43, 53 including the shutter part 44, 54 is provided in a crank shape projecting toward the Y1 side, and the extending part 43, 53 including the shutter part 44, 54 is provided in a crank shape projecting toward the Y2 side.

The shutter part 44, 54 is provided with the opening 45, 55. The opening 45, 55 is a hole portion punched through the shutter part 44, 54. By the first shutter 40A and the second shutter 50A moving along the X direction as will be described later, a region in which electric flux lines heading from a detection target object toward the sensor electrode 60 pass through can be changed. Note that in this embodiment, the size and shape of the opening 45, 55 are set identical between the first shutter 40A and the second shutter 50A, but the opening 45 of the first shutter 40A and the opening 55 of the second shutter 50A need not be of the identical size and shape. Note that the opening 45 corresponds to a first opening, and the opening 55 corresponds to a second opening Next, the sensor electrode 60 (corresponding to a sensor) will be described. The sensor electrode 60 is disposed on an upper side (Z1 side) of the coil unit 30, that is, on a lower side (Z2 side) of the first shutter 40A and the second shutter 50A. The sensor electrode 60 has leg parts 61 and flange parts 62, and has a detecting part 63. The leg parts 61 separate the detecting part 63 from the printed circuit board 70 to make the detecting part 63 close to the side of the shutter parts 44, 54 in order to increase the detection sensitivity in the detecting part 63. This detecting part 63 is provided to be in parallel to the shutter parts 44, 54.

The sensor electrode 60 forms electric flux lines between itself and the detection target object existing on the upper side (Z1 side). Then, the shutter parts 44, 54 are located between the detection target object and the sensor electrode 60, and when the shutter parts 44, 54 move along the X direction, the ratio of blocking the electric flux lines in the Z direction by the shutter parts 44, 54 which are metal changes, and thereby an alternating current is obtained in the sensor electrode 60. In a not-illustrated detection circuit (existing in the printed circuit board 70) in which the alternating current flows, a voltage (amplitude) corresponding to the charge of the detection target object is obtained. Then, the charge in the detection target object can be measured by measuring such a voltage.

Note that the printed circuit board 70 (corresponding to a first base plate) to which the sensor electrode 60 is attached has holes 71 through which the leaf spring parts 41, 51 of the first shutter 40A and the second shutter 50A can be inserted. The holes 71 are provided to have dimensions of a degree that, when an electric current is conducted through the coil 33 and the leaf spring parts 41, 51 vibrate in the X direction, they do not interfere with this vibration of the leaf spring parts 41, 51. Note that the printed circuit board 70 may be included in the concept of the potential measuring device 10A, but the printed circuit board 70 need not be included in the concept of the potential measuring device 10A.

Next, the four magnets 80 will be described. The magnets 80 are attached at positions opposing the respective yoke flange parts 312 on the pair of leaf spring parts 41 of the first shutter 40A, and are attached at the positions opposing the respective yoke flange parts 312 on the pair of leaf spring parts 51 of the second shutter 50A. Further, in this embodiment, as illustrated in FIG. 1 and FIG. 2, the magnets 80 are provided so as to oppose the regions of the bobbin flange parts 322 where the cutouts 323 exist.

The magnets 80 attached respectively to the pair of leaf spring parts 41, 41 of the first shutter 40A are magnetized so that the same magnetic poles oppose each other, and similarly, the magnets 80 attached respectively to the pair of leaf spring parts 51, 51 of the second shutter 50A are magnetized so that the same magnetic poles oppose each other. Further, the respective magnets 80 are magnetized so that when the shutter part 44 of the first shutter 40A moves toward one side in the X direction, the shutter part 54 of the second shutter 50A moves toward the other side in the X direction.

Next, the four back yokes 100 (corresponding to a coil outside a yoke) will be described. The back yokes 100 are formed of the same soft magnetic material as that of the yokes 31. The back yokes 100 may be formed of a different soft magnetic material from that of the yokes 31. Further, in this embodiment, each back yoke 100 has an appearance in a substantially columnar shape. An end surface (opposing end surface 101) on the side of the back yoke 100 that opposes a magnet 80 is flat. Further, in an end surface (external end surface 102) on the side of the back yoke 100 that is opposite to the magnet 80, a slit 103 for allowing fitting of the tip of a screw driver is provided.

Further, in this embodiment, the back yoke 100 is for adjusting the distance to the magnet 80. Specifically, a thread part 104 (FIG. 3) in which a screw thread is formed is provided in an outer periphery of the back yoke 100. Further, in the rising parts 22 of the frame member 20, a screw hole 22a is formed at each position opposing a magnet 80 in the X direction. In such a structure, by fitting the tip of a screwdriver in the slit 103 and rotating the back yoke 100 relative to the rising parts 22, the back yoke 100 moves along the X direction, and thereby the back yoke 100 is moved toward or away from the magnet 80. Accordingly, the gap between the magnet 80 and the back yoke 100 varies, and a magnetic force therebetween changes. Then, by this change of the magnetic force the natural frequency in the first shutter system 400A or the second shutter system 500A changes.

Further, in a state that the back yoke 100 is screwed into the screw hole 22a, the opposing end surface 101 is in parallel to the opposing surface of the leaf spring part 41, 51. Thus, it is possible to widen an adjusting width of the gap. However, in the case where the gap between the back yoke 100 and the magnet 80 and the gap between the magnet 80 and the yoke 31 are the same, and the magnetic coupling force of the former is larger (stronger) than the magnetic coupling force of the latter, or in similar cases, the opposing end surface 101 need not be in parallel to the opposing surface of the leaf spring part 41, 51. Further, although it is preferred that the opposing end surface 101 be flat, in the case where it is stronger than the magnetic coupling force between the magnet 80 and the yoke 31, or in similar cases, the opposing end surface 101 may be in a state that irregularities exist thereon.

<Regarding Operations>

Operations of the potential measuring device 10A having the above-described structure will be described below.

When an alternating current is conducted through the pair of coils 33 (coils 331, 332) by a driving circuit of the driving base plate 11, the shutter part 44 of the first shutter 40A and the shutter part 54 of the second shutter 50A repeat to move backward and forward in the X direction. More specifically, the shutter part 44 and the shutter part 54 move in the X direction so that when the shutter part 44 moves to one side in the X direction, the shutter part 54 moves to the other side which is opposite thereof.

Here, the principle of this movement will be described. When an electric current is conducted through the coil 331, a magnetic field is generated with one end of the coil 331 being the north pole, and a magnetic field is generated with the other end being the south pole. The coil 331 is disposed on the winding part 311 of the yoke 31, and on both end sides of the coil 331, yoke flange parts 312 are provided respectively. Therefore, the magnetic fields generated in the coil 331 are led to the yoke flange parts 312, and the magnetic poles are formed in the yoke flange parts 312. That is, the same magnetic poles generated on the respective ends of the coil 331 are generated on the yoke flange parts 312.

The yoke flange parts 312 of the yoke 31 and the magnets 80 are attached respectively at positions opposing each other as illustrated in FIG. 1 and FIG. 2.

A pair of magnets 80 has the same magnetic pole. For example, it is assumed that the magnets 80 are magnetized to have the north pole. In this case, when an electric current flows through the coil 331, one side of the pair of yoke flange parts 312 (for example, the right side (X1 direction side) of FIG. 2) of one coil unit (for example, the coil unit located on a front side (Y2 direction side) of FIG. 1) becomes the north pole, and the other (for example, the left side (X2 direction side) of FIG. 2) becomes the south pole, the yoke flange part 312 (on the right side) which has become the north pole and the magnet 80 exert magnetic forces in pushing directions on each other, and thereby a force which separates them from each other is generated between this yoke flange part 312 and the magnet 80.

On the other hand, the yoke flange part 312 (for example, on the left side (X2 direction side) of FIG. 2) of the south pole and the magnet 80 exert magnetic forces in pulling directions on each other, and thereby a force which pulls them to each other is generated between this yoke flange part 312 (on the left side) and the magnet 80.

By the force generated by such application of a magnetic force from the coil 331 (yoke flange parts 312), the leaf spring parts 41 to which the magnets 80 are attached elastically deform so as to incline (for example, the magnet 80 on the left side moves toward the yoke flange part 312, and the magnet 80 on the right side moves away from the yoke flange part 312). Thus, the shutter part 44 of the first shutter 40A is moved in the X direction (for example, moves to the right side).

An alternating current is conducted through the coil 331. As a result, the direction of the electric current flowing through the coil 331 reverses at every predetermined time, and thus the magnetic poles occurring in the yoke flange parts 312 reverse alternately. As a result, the shutter part 44 of the first shutter 40A moves in the direction corresponding to the magnetic poles occurring in the yoke flange parts 312 according to the above-described principle, and thus the moving direction thereof switches. Specifically, the shutter part 44 of the first shutter 40A vibrates in the X direction.

The second shutter 50A repeats movement cycles by the same principle as described above, but an alternating current is applied to the coil 332 so that the phase of vibration of the second shutter 50A are reversed. Making the vibrations of the two shutter 40A, 50A of reverse phases can be realized by either of a configuration such that the current directions of the two coils 33 are of the same phase and the magnets 80 have opposite polarities, or a configuration such that the current directions of the two coils 33 are of reverse phases and the magnets 80 have the same polarities, as will be described later. Thus, the shutter part 54 can be moved in an opposite direction relative to the shutter part 44.

Note that the magnetic flux heading toward an upper side (Z1 side) among magnetic fluxes generated by the coil 331, 332 passes through the inside of a shield member. Thus, on a surface side of the printed circuit board 70, the influence by the magnetic flux can be reduced.

By the shutter part 44 and the shutter part 54 moving thus in the X direction, for example, magnetic flux lines based on the surface potential of the detection target object existing at the position opposing the shutter part 44 and the shutter part 54 are cut, and an alternating voltage in proportion to the surface potential of the measured object is induced in the sensor electrode 60. By the generated alternating voltage, the charge of the detection target object is measured.

<Regarding Effects>

In the potential measuring device 10A having a structure as above, the magnets 80 are attached respectively to the pair of leaf spring parts 41 in the first shutter 40A, and the magnets 80 are attached respectively to the pair of leaf spring parts 51 in the second shutter 50A. Then, these magnets 80 are disposed in a state of opposing the both end sides of the coils 331, 332 via the yoke flange parts 312.

Accordingly, when the alternating current is conducted through each of the coils 331, 332, it is possible to simultaneously exert the magnetic forces occurring on the both end sides of the coils 331, 332 on the magnets 80 respectively via the yoke flange parts 312. Specifically, when the magnets 80 are disposed on the leaf spring parts 41 to oppose the coils 331, 332 only in the X1 direction, the magnetic force is applied to the leaf spring parts 41 only in the X1 direction from the coils 331, 332, and thus a large driving force cannot be obtained. In this respect, in the potential measuring device 10A in this embodiment, since the magnets 80 are disposed on the leaf spring parts 41 to oppose the coils 331, 332 in both the X1 direction and the X2 direction, a driving force of about double can be obtained as compared to the case where the magnets 80 are disposed to oppose the coils 331, 332 only in the X1 direction. Specifically, in the potential measuring device 10A in this embodiment, magnetic fluxes are effectively utilized on either of the both end sides in the longitudinal direction of the coils 331, 332, thereby obtaining good magnetic efficiency.

Further, in this embodiment, in the first shutter 40A and the second shutter 50A, the leaf spring parts 41, 51 have a shape bent relative to the shutter parts 44, 54. Accordingly, while securing the entire lengths of the first shutter 40A and the second shutter 50A, it is possible to reduce a length dimension (dimension in the X direction) of the potential measuring device 10A. Further, in the first shutter 40A and the second shutter 50A, in a state that the leaf spring parts 41, 51 do not vibrate, the leaf spring parts 41, 51 extends along the upward and downward direction (Z direction), and moreover a plate width direction of the leaf spring parts 41, 51 is along the width direction (Y direction). Thus, the shutter parts 44, 54 can be moved reciprocally along the length direction (X direction) of the potential measuring device 10A.

Further, in this embodiment, by moving the shutter parts 44, 54 reciprocally along the length direction (X direction), the width dimension (dimension in the Y direction) in the potential measuring device 10A can be reduced. Specifically, as in conventional devices, when the shutter parts are structured to vibrate in the width direction (Y direction), an excess space (dead space) is necessary in the width direction (Y direction) in consideration of the case where the shutter parts are positioned on the outside at a maximum when they vibrate. However, in the potential measuring device 10A in this embodiment, they are structured to be moved reciprocally along the length direction (X direction), and thus the excess space (dead space) is not necessary in the width direction (Y direction). Accordingly, in the potential measuring device 10A, it is possible to reduce the width dimension (dimension in the Y direction).

Further, in this embodiment, the projecting portion projecting toward the Y1 side from the extending part 43 exists on the shutter part 44 of the first shutter 40A, and a projecting portion projecting toward the Y2 side from the extending part 53 exists on the shutter part 54 of the second shutter 50A. Then, the two shutter parts 44, 54 are disposed in a state of opposing each other, and the opening 45 and the opening 55 are capable of being positioned at a position where they overlap with each other on the XY plane. In such a structure, areas of the shutter parts 44, 54 can be secured largely, and opening areas S of the openings 45, 55 provided in the shutter parts 44, 54 can be made large. Further, by making the opening areas S of the openings 45, 55 large, a change ΔS of the opening areas S when the shutter parts 44, 54 move in opposite directions to each other can be made large. Thus, measurement sensitivity of the potential measuring device 10A can be improved.

Moreover, in this embodiment, the sensor electrode 60 is attached to the printed circuit board 70 located on the upper side (Z1 side) of the coil 33, and the driving circuit for driving the coils 33 is provided on the driving base plate 11 located on the lower side (Z2 side) of the coils 33. Thus, the printed circuit board 70 to which the sensor electrode 60 for detecting a weak electric current is attached and the driving base plate 11 on which the driving circuit conducting a large electric current for driving the coils 33 is provided are provided separately, and they are also provided at different positions. Thus, occurrence of the influence of noise by driving the coils 33 can be reduced in the printed circuit board 70 to which the sensor electrode 60 is attached.

Further, a shield member is provided on a rear surface side (surface on the Z2 side) of the printed circuit board 70. Thus, it is possible to prevent the magnetic flux generated from the coil 33 from affecting the sensor electrode 60 existing on the rear surface side (surface on the Z1 side) of the printed circuit board.

Moreover, in this embodiment, the magnets 80 are attached to a lower side (Z2 side) of the leaf spring parts 41, 51 below a center side in the upward and downward direction (Z direction) of the leaf spring parts 41, 51. Specifically, the magnets 80 are not attached to a side of the leaf spring parts 41, 51 where the amplitude increases, but are attached to a lower side (Z2 side) of the leaf spring parts 41, 51 where the amplitude becomes relatively small. Thus, a gap needed for reciprocal movement of the magnets 80 can be made relatively small between the magnets 80 and the yoke flange parts 312. Further, by making the gaps between the yoke flange parts 312 and the magnets 80 small, it is possible to prevent the magnetic force operating in the gaps from becoming weak.

Further, in this embodiment, the magnets 80 oppose the back yokes 100 on the opposite sides of the sides opposing the yoke flange parts 312. Thus, the magnets 80 can exert a magnetic force in a direction to pull each other between them and the yoke flange parts 312, and a much larger driving force can be obtained. Further, with such a structure, much better magnetic efficiency can be obtained.

Note that in the potential measuring device 10A in this embodiment, adjustment of natural frequency is possible by screwing the thread part 104 of the back yoke 100 into the screw hole 22a, and also by such adjustment of natural frequency, good sensitivity of the potential measuring device 10A can be obtained.

Other Embodiments

Next, other embodiments of the present invention will be described. Note that in the other embodiments, same components as those in the potential measuring device 10A of the above-described first embodiment are given the same reference numerals for description.

<Another Potential Measuring Device—Part 1>

Figure 6:
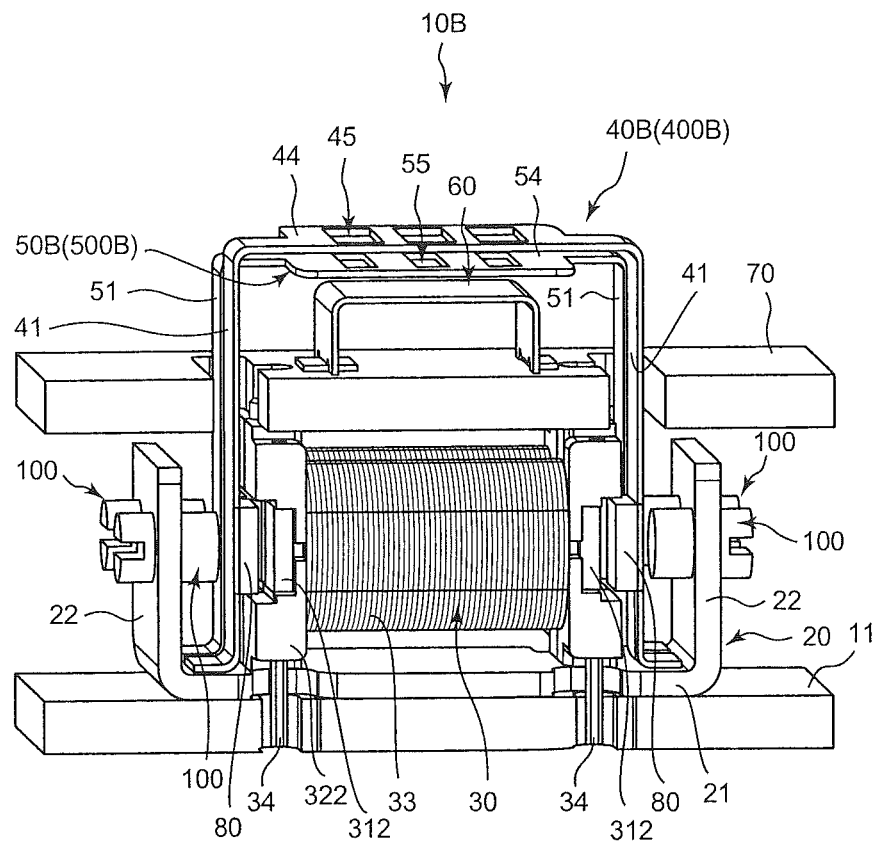
FIG. 6 is a perspective view illustrating a potential measuring device according to a modification example of the present invention which has shutter parts in which three openings are provided in each shutter part.
Figure 6:
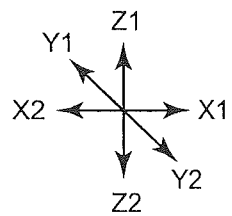

FIG. 6 is a perspective view illustrating a potential measuring device 10B according to another embodiment. In this potential measuring device 10B, openings 45, 55 of shutter parts 44, 54 are different from those of the potential measuring device 10A. Specifically, in the potential measuring device 10B illustrated in FIG. 6, pluralities of openings 45, 55 are provided to line in the X direction in the shutter parts 44, 54 (three each in the respective shutter parts 44, 54 in FIG. 6). Note that the openings 45, 55 are not limited to the structure in which three each of them are provided in the respective shutter parts 44, 54 as illustrated in FIG. 6, and any number of them may be provided as long as it is two or more. Further, in the structure illustrated in FIG. 6, the openings 45 in the first shutter 40B are provided to be larger in opening area than the openings 55 in the second shutter 50B, but it is not necessary to employ such a structure.

<Another Potential Measuring Device—Part 2>

Figure 7:
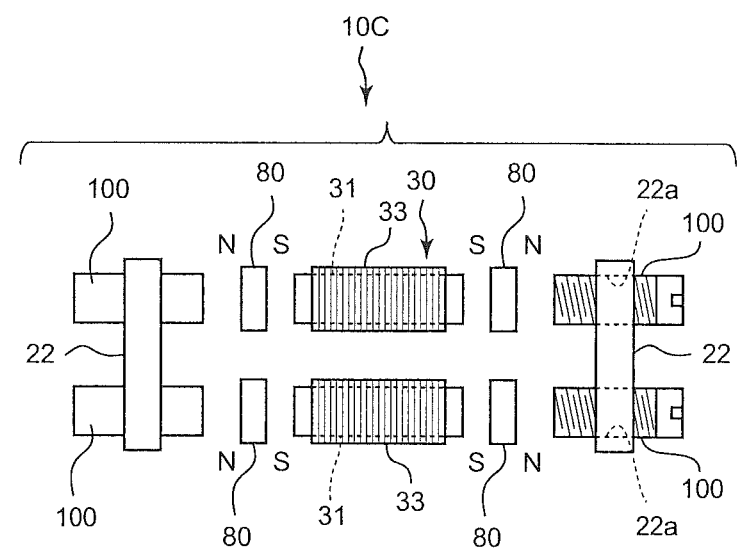
FIG. 7 is a diagram schematically illustrating a disposition of a coil unit and a balance adjusting mechanism according to a modification example of the present invention, and illustrating a structure in which back yokes are disposed on one side in a longitudinal direction and fixed back yokes are disposed on the other side in the longitudinal direction.
Figure 7:
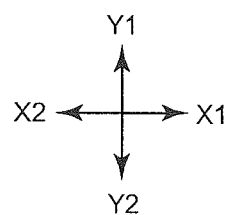

Further, a potential measuring device 10C as illustrated schematically in FIG. 7 may be employed. FIG. 7 illustrates a structure in which four magnets 80 in total, two yokes 31, and two coils 33 exist. In this structure illustrated in FIG. 7, on one side (X1 side) in the longitudinal direction, back yokes 100 each having a thread part 104 capable of adjusting a gap to a magnet 80 by being screwed into a screw hole 22a are provided. However, on the other side (X2 side) in the longitudinal direction, although back yokes 100 are provided, gaps to the magnets 80 cannot be adjusted. Also in such a structure, it is possible to obtain good magnetic efficiency as compared to conventional structures, and a large driving force can be obtained. Further, on one side (X1 side) in the longitudinal direction, adjustment of natural frequency is possible by adjusting a screwing amount of the back yoke 100 into the screw hole 22a.

<Another Potential Measuring Device—Part 3>

Figure 8:
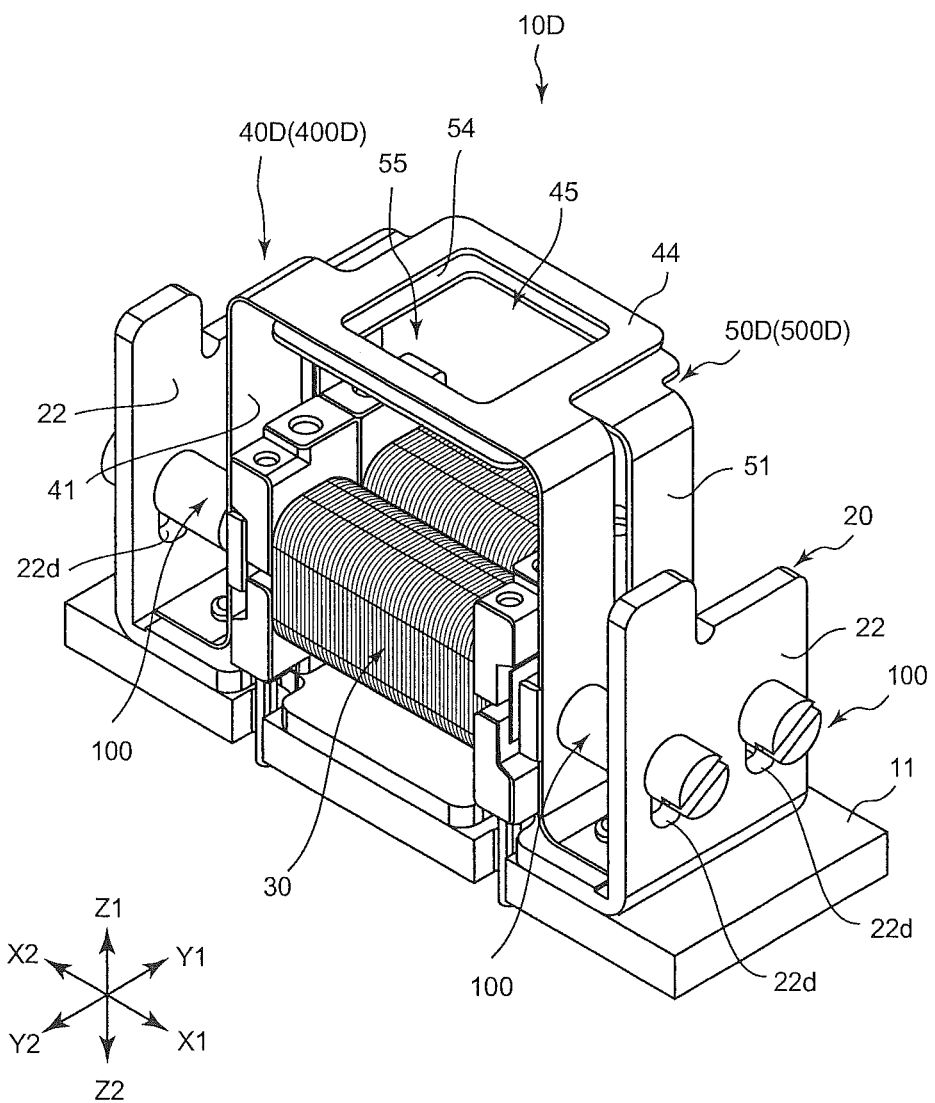
FIG. 8 is a perspective view illustrating a structure of a potential measuring device according to a modification example of the present invention in which screw holes into which back yokes are screwed are provided to have a long hole shape which is long in an upward and downward direction.

Further, a potential measuring device 10D as illustrated in FIG. 8 may be employed. In the potential measuring device 10D illustrated in FIG. 8, screw holes 22d are different from the screw holes 22a. Specifically, in the potential measuring device 10D illustrated in FIG. 8, the screw holes 22d are provided to have a long hole shape instead of circular holes like the screw holes 22a of the potential measuring device 10A illustrated in FIG. 1. A screw hole 22d has a semicircular edge in both upper and lower ends, and a portion connecting these upper and lower semicircular edges is an edge with a certain width. Owing to such a shape, back yokes 100 can be moved along the upward and downward direction (Z direction) in the screw holes 22d.

In the potential measuring device 10D having such a structure illustrated in FIG. 8, besides adjustment of screwing amounts of the back yokes 100 into the screw holes 22d, positions in the upward and downward direction (Z direction) of the back yokes 100 are also adjustable. With such back yokes 100, adjustment of natural frequency is possible not only by adjustment of screwing amounts of the back yokes 100, but also by adjustment of positions of the back yokes 100 in the Z direction.

<Another Potential Measuring Device—Part 4>

Figure 9:
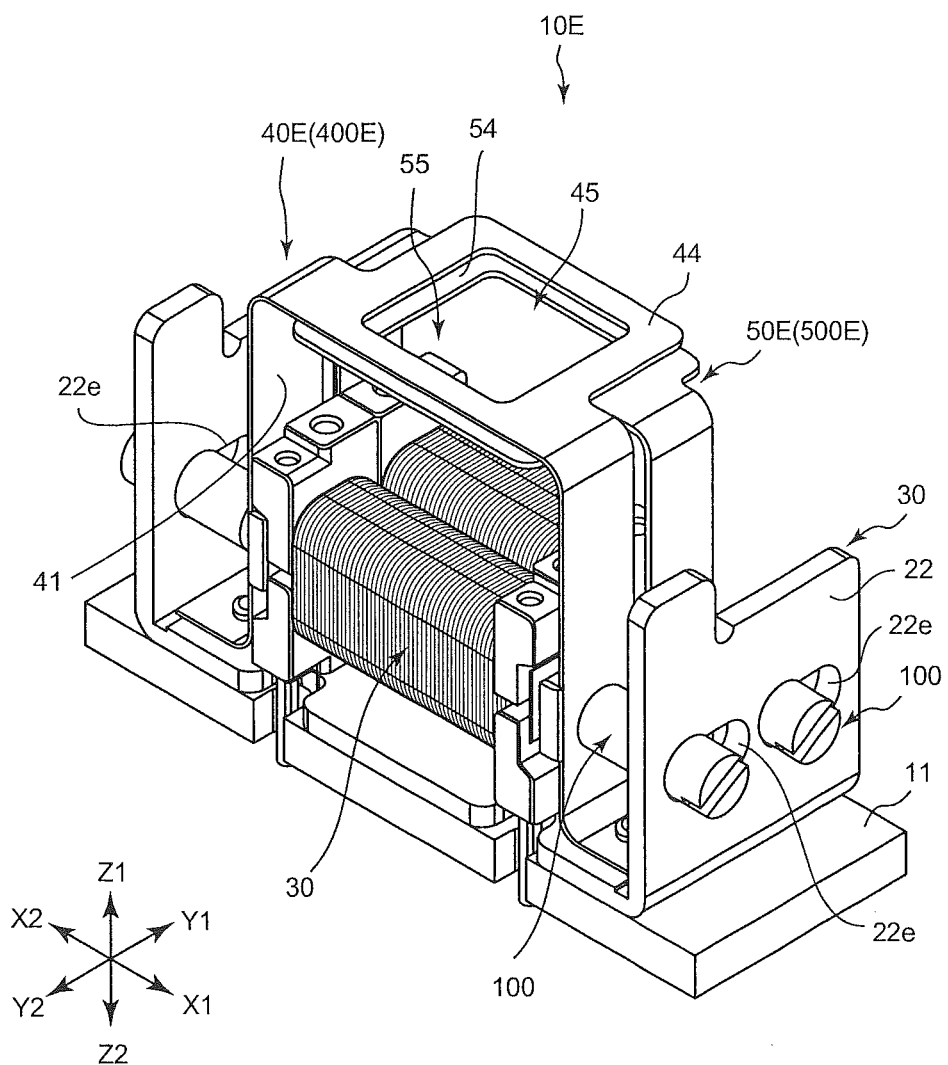
FIG. 9 is a perspective view illustrating a structure of a potential measuring device according to a modification example of the present invention in which screw holes into which back yokes are screwed are provided to have a long hole shape which is long in a forward and backward direction.

Further, a potential measuring device 10E as illustrated in FIG. 9 may be employed. In the potential measuring device 10E illustrated in FIG. 9, although it is similar to the potential measuring device 10D illustrated in FIG. 8, directions of screw holes 22e having a long hole shape are different from those of the screw holes 22d similarly having a long hole shape. Specifically, in the potential measuring device 10E illustrated in FIG. 9, the screw holes 22e have a semicircular edge in both ends in the forward and backward direction (Y direction), and a portion connecting these forward and backward semicircular edges is an edge with a certain width. Owing to such a shape, back yokes 100 can be moved along the forward and backward direction (Y direction) in the screw holes 22e.

In the potential measuring device 10E having such a structure illustrated in FIG. 9, besides adjustment of screwing amounts of the back yokes 100 into the screw holes 22e, positions in the forward and backward direction (Y direction) of the back yokes 100 are also adjustable. With such back yokes 100, adjustment of natural frequency is possible not only by adjustment of screwing amounts of the back yokes 100, but also by adjustment of positions of the back yokes 100 in the Y direction.

<Other Potential Measuring Devices—Part 5>

Figure 10:
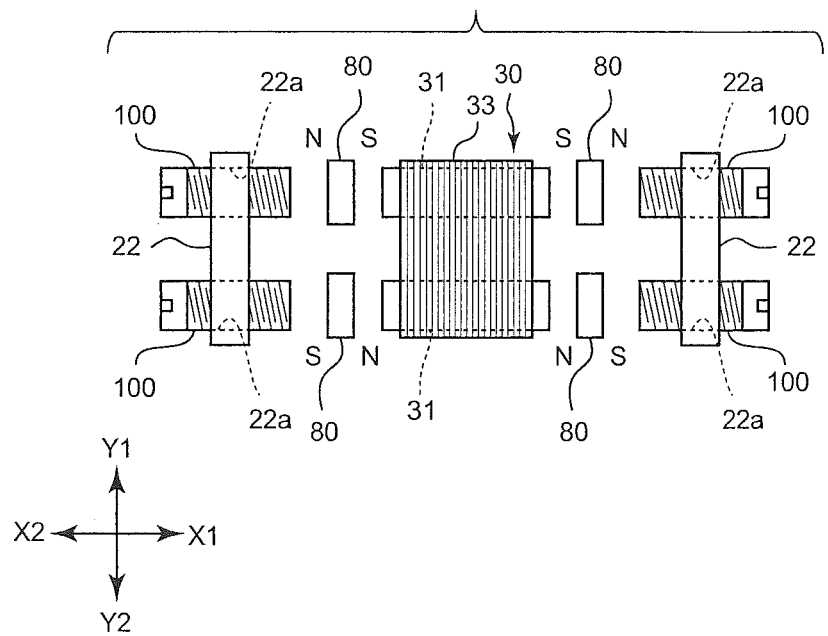
FIG. 10 is a diagram schematically illustrating a disposition of a coil unit and back yokes according to a modification example of the present invention, and illustrating a structure in which two yokes in total, four magnets in total, four back yokes in total, and one coil are disposed.
Figure 11:
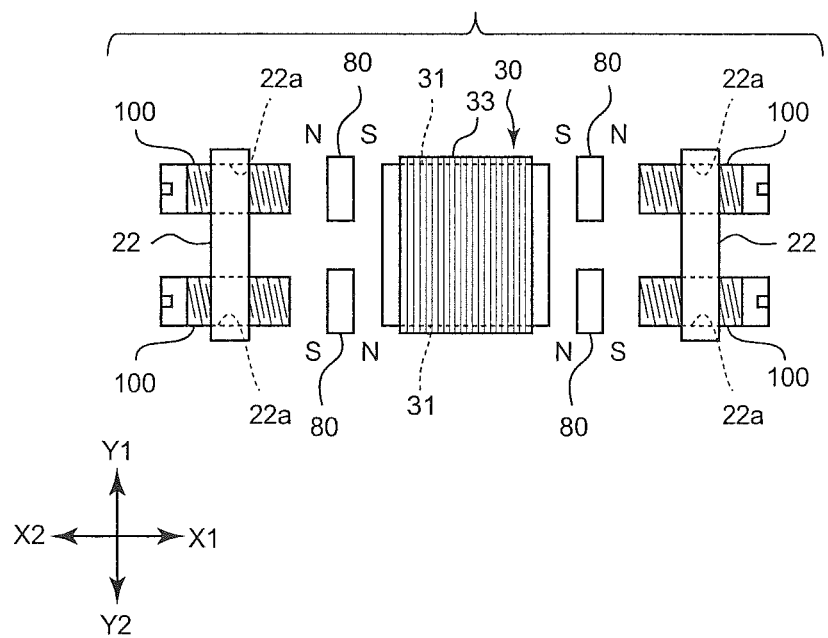
FIG. 11 is a diagram schematically illustrating a disposition of a coil unit and back yokes according to a modification example of the present invention, and illustrating a structure in which four magnets in total, four back yokes in total, and one yoke and one coil are disposed.

Further, in the above-described potential measuring devices 10A, 10B, 10D, 10E, a structure as illustrated in FIG. 10 and FIG. 11 may be employed as the coil unit 30 and/or the back yoke 100.

FIG. 10 illustrates a structure in which there exist two yokes 31 in total, four magnets 80 in total, and four back yokes 100 in total, but only one coil 33 exists. Specifically, in the structure illustrated in FIG. 10, the one coil 33 is wound across the two yokes 31. When the coil unit 30 has such a structure, by setting magnetization directions of the magnets 80 opposing one yoke 31 and magnetization directions of the magnets 80 opposing the other yoke 31 in opposite directions, the first shutter 40A and the second shutter 50A can be driven in opposite directions to each other. Also, by obtaining good magnetic efficiency between the coil unit 30 and the magnets 80, the driving force applied to the first shutter 40A and the second shutter 50A can be made large. Further, adjustment of natural frequency is also possible by adjusting screwing amounts of the back yokes 100 into screw holes 22a.

FIG. 11 illustrates a structure in which there exist four magnets 80 in total and four back yokes 100 in total, but one yoke 31 and one coil 33 exist. Specifically, in the structure illustrated in FIG. 11, the volume of the yoke 31 is larger than the volumes of the yokes 31 illustrated in FIG. 10, and one coil 33 is wound on such a yoke 31 having a large volume. When the coil unit 30 has such a structure, by setting magnetization directions of the magnets 80 opposing one side of the yoke 31 and magnetization directions of the magnets 80 opposing the other side of the yoke 31 in opposite directions, the first shutter 40A and the second shutter 50A can be driven in opposite directions to each other. Also, by obtaining good magnetic efficiency between the coil unit 30 and the magnets 80, the driving force applied to the first shutter 40A and the second shutter 50A can be made large. Further, adjustment of natural frequency is also possible by adjusting screwing amounts of the back yokes 100 into screw holes 22a.

<Another Potential Measuring Device—Part 6>

Figure 12A:
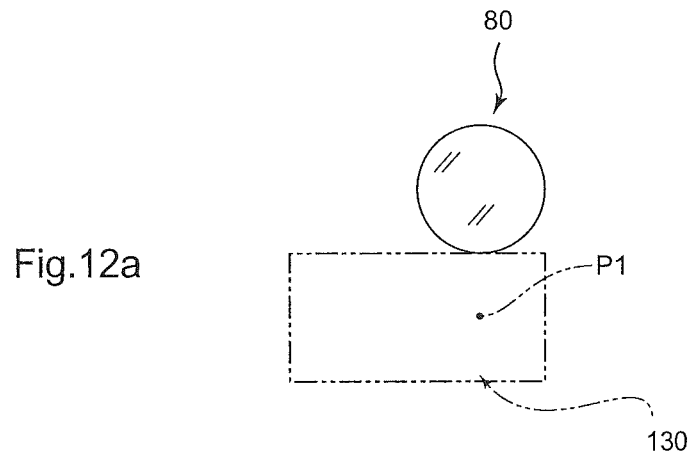
FIGS. 12a-12c are diagrams schematically illustrating a magnet and a back yoke according to a modification example of the present invention, and illustrating a structure in which a pole face of a magnet is a circular shape, and an opposing plate having a rectangular shape which pivots about a fulcrum relative to the pole face exists.
Figure 12B:
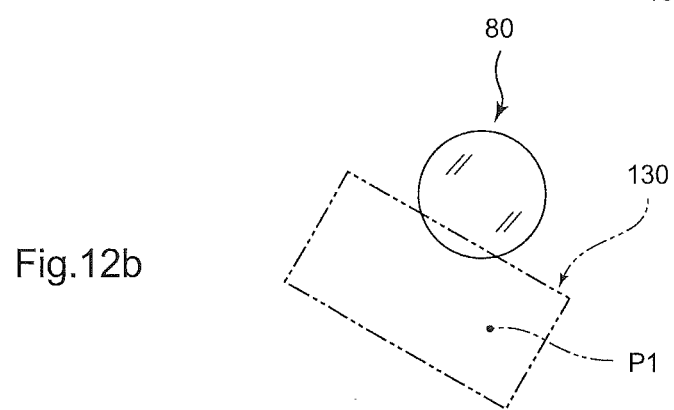
Figure 12C:
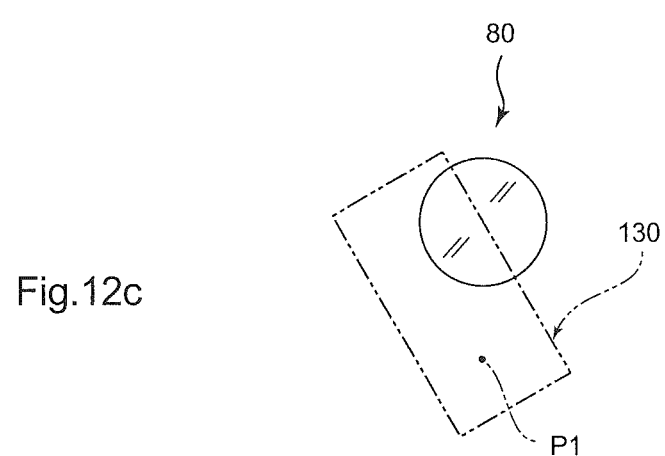
Figure 13A:
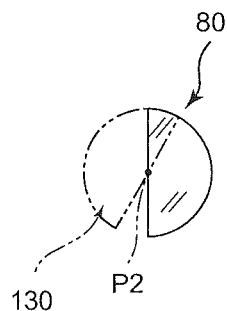
FIGS. 13a-13c are diagrams schematically illustrating a magnet and a back yoke according to a modification example of the present invention, and illustrating a structure in which a pole face of a magnet is a semicircular shape, and an opposing plate having a semicircular shape which pivots about a fulcrum relative to the pole face exists.
Figure 13B:
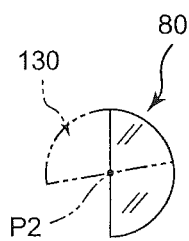
Figure 13C:
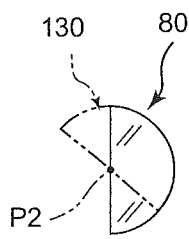
Figure 14A:
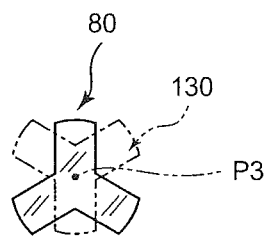
FIGS. 14a-14c are diagrams schematically illustrating a magnet and a back yoke according to a modification example of the present invention, and illustrating a structure in which three portions of a magnet which have a predetermined width extend toward an outer peripheral side from the center of a pole face at 120-degree intervals.
Figure 14B:
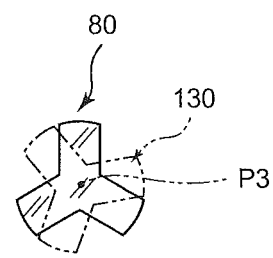
Figure 14C:
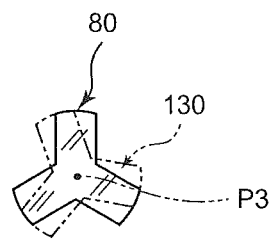

Further, in the above-described potential measuring devices 10A to 10E, structures as illustrated in FIG. 12 to FIG. 14 may be employed as the magnets 80 and the back yoke 100.

FIG. 12 illustrates a structure in which a pole face of a magnet 80 is a circular shape, and an opposing plate 130 pivoting about a fulcrum P1 relative to the pole face exists, the opposing plate 130 performing a function as the back yoke. By pivoting the opposing plate 130 about the fulcrum P1, an area of the opposing plate 130 that opposes the pole face changes. By this change of the opposing area, the magnetic force between the magnet 80 and the opposing plate 130 changes. Thus, the natural frequency of at least one of the first shutter system 400A and the second shutter system 500A can be adjusted.

FIG. 13 illustrates a structure in which, similarly to FIG. 12, an opposing plate 130 performing a function as the back yoke opposes a magnet 80. However, in FIG. 13, the pole face of the magnet has a semicircular shape, and the opposing surface of the opposing plate 130 also has a semicircular shape. By pivoting the opposing plate 130 about a fulcrum P2, an area of the opposing plate 130 that opposes the pole face changes. By this change of the opposing area, the magnetic force between the magnet 80 and the opposing plate 130 changes. Thus, the natural frequency of at least one of the first shutter system 400A and the second shutter system 500A can be adjusted.

FIG. 14 illustrates a structure in which, similarly to FIG. 12, an opposing plate 130 performing a function as the back yoke opposes a magnet 80. However, FIG. 14 illustrates a shape such that three portions of the magnet 80 which have a predetermined width extend toward an outer peripheral side from the center of a pole face at 120-degree intervals (referred to as a three-piece shape). Also in such a structure, by pivoting the opposing plate 130 about a fulcrum P3, an area of the opposing plate 130 that opposes the pole face changes. By this change of the opposing area, the magnetic force between the magnet 80 and the opposing plate 130 changes. Thus, the natural frequency of at least one of the first shutter system 400A and the second shutter system 500A can be adjusted.

MODIFICATION EXAMPLES

In the foregoing, the potential measuring device according to the embodiment of the present invention and the other potential measuring devices have been described, but the present invention can be modified in various other ways. Such modifications will be described below.

Each potential measuring device 10A to 10E related to the potential measuring device according to the above-described embodiment and the other potential measuring devices employs a structure using the bobbins 32, but a structure in which the bobbins are omitted may be employed. Further, although each potential measuring device 10A to 10E related to the potential measuring device according to the above-described embodiment and the other potential measuring devices employs a structure using the yokes 31, a structure in which the yokes 31 are omitted may be employed. Further, when the bobbins 32 are formed, for example, the bobbins 32 may be formed by mixing a magnetic material in a resin, thereby providing the bobbin 32 with the function of the yoke 31.

Further, a coil unit formed of a yoke and a coil may be structured as follows. For example, a ring-shaped yoke may be cut to be semicircles to form half-ring shapes, a coil may be wound on a half-ring shaped yoke, one end side in a circumferential direction of the half-ring shape may be set to oppose a magnet attached to a leaf spring part of the first shutter, and the other end side in the circumferential direction of the half-ring shape may be set to oppose a magnet attached to a leaf spring part of the second shutter. Then, two sets of such coil units in which a coil is wound on the half-ring shaped yoke may be used, and they may be disposed to line along the X direction. Note that various shapes can be employed for the half-ring shapes, such as semicircle shapes, semi-elliptic shapes, ones obtained by cutting a rectangular ring shape in half, and the like.

Further, each potential measuring device 10A to 10E related to the potential measuring device according to the above-described embodiment and the other potential measuring devices employs a structure in which two coil units 30 are provided along the Y direction. However, the number of coil units 30 is not limited to two. For example, two coil units may be disposed in line in a direction along the Y direction, and two coil units may be disposed in line in a direction along the Z direction, using four coil units in total. Alternatively, a structure may be employed in which at least one or more coil units are disposed along at least one of the X direction, the Y direction and the Z direction, and three or more coil units in total are disposed in line.

Further, in each potential measuring device 10A to 10E related to the potential measuring device according to the above-described embodiment and the other potential measuring devices, the opening 45, 55 have a rectangular shape. However, the openings 45, 55 may employ a shape other than the rectangular shape. Examples of such a shape include various shapes such as a circular shape, an elliptic shape, and a polygonal shape.

Further, in each potential measuring device 10A to 10E related to the potential measuring device according to the above-described embodiment and the other potential measuring devices, the printed circuit board 70 and the sensor electrode 60 form a potential measuring device. However, the printed circuit board 70 need not be a component of the potential measuring device. Also the sensor electrode 60 need not be a component of the potential measuring device.

Figure 15:
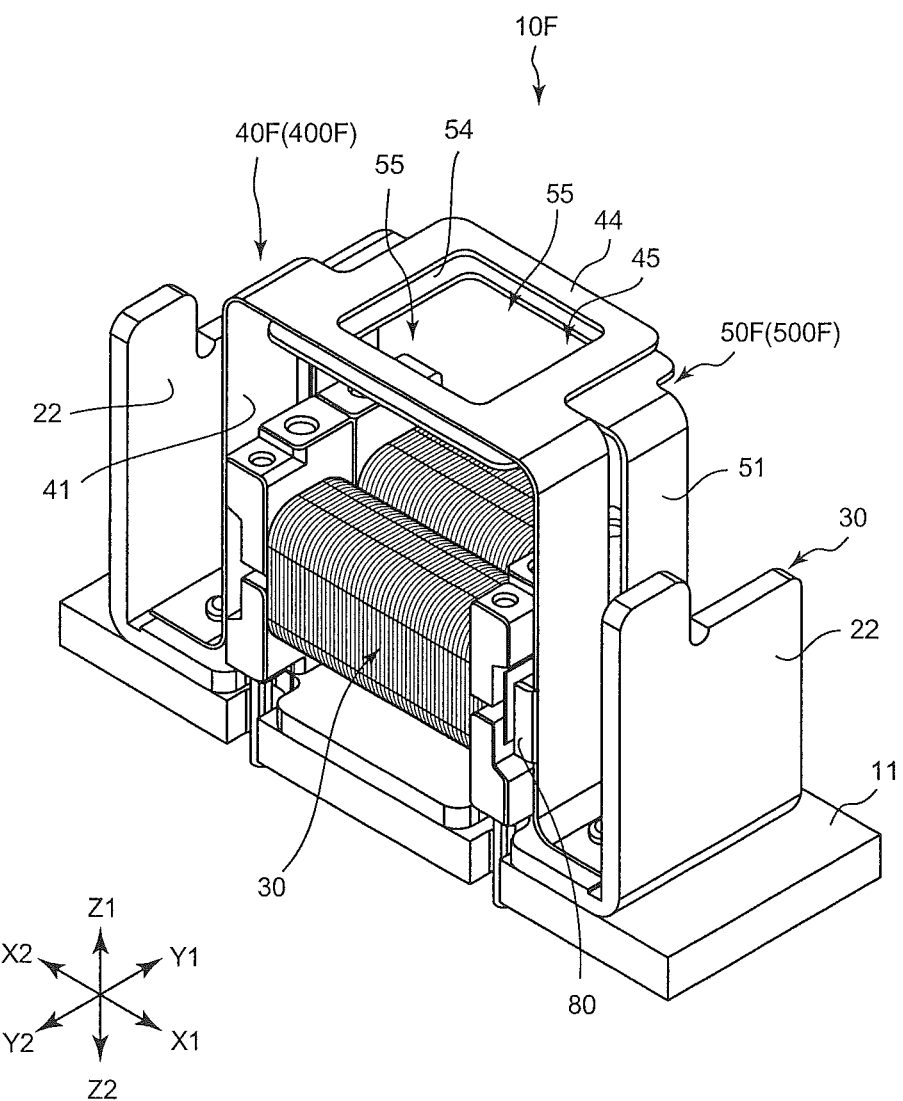
FIG. 15 is a perspective view illustrating a structure according to a modification example of the present invention in which while magnets are provided on one side in the longitudinal direction, magnets are not provided on the other side in the longitudinal direction, and back yokes are not provided on both the one side and the other side in the longitudinal direction.

In addition, a structure as illustrated in FIG. 15 may be employed as another potential measuring device. In a potential measuring device 10F illustrated in FIG. 15, a magnet 80 is attached to a leaf spring part 41 on one side (X1 side) in the longitudinal direction (X direction) out of the pair of leaf spring parts 41 in a first shutter 40F. Similarly, a magnet 80 is attached to a leaf spring part 51 on one side (X1 side) in the longitudinal direction (X direction) out of the pair of leaf spring parts 51 in a second shutter 50F. However, the magnets 80 are not attached to the leaf spring parts 41, 51 on the other side (X2 side) in the longitudinal direction (X direction). Further, the potential measuring device 10F is not provided with a back yoke 100. However, such a potential measuring device 10F allows reduction in size and increase in change of opening areas of openings.

Figure 16:
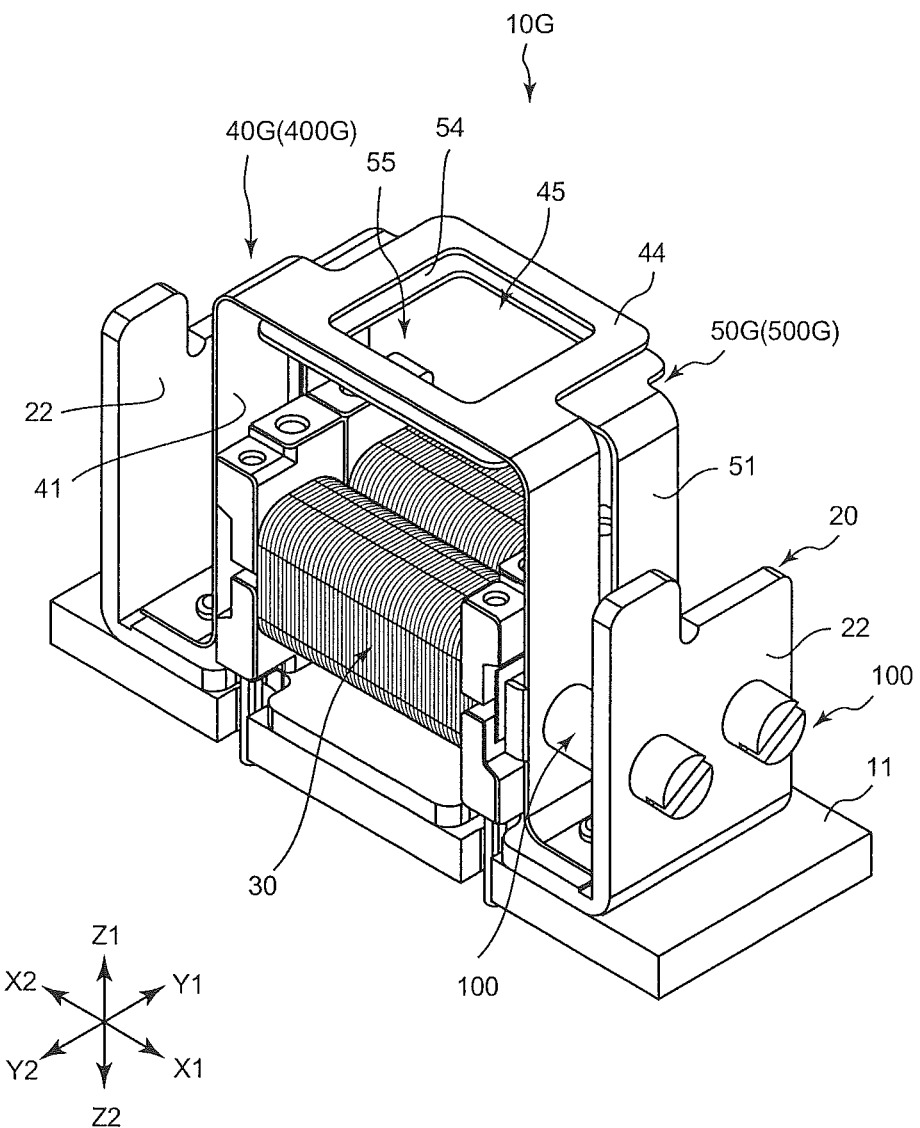
FIG. 16 is a perspective view illustrating a structure according to a modification example of the present invention in which while back yokes and magnets are provided on one side in the longitudinal direction, they are not provided on the other side in the longitudinal direction.

Further, a structure as illustrated in FIG. 16 may be employed as another potential measuring device. A potential measuring device 10G illustrated in FIG. 15 corresponds to a structure in which back yokes 100 are provided further on one side (X1 side) in the longitudinal direction (X direction) in the potential measuring device 10F illustrated in FIG. 15. Such back yokes 100 may be capable of being screwed into a screw hole 22a, or the back yokes 100 may be provided fixedly on a rising part 22.

Further, in the potential measuring device according to the above-described embodiment and the other potential measuring devices, a structure may be employed in which, for example, a coil 33 is provided only on one side in the forward and backward direction (Y direction), but the coil 33 is not provided on the other side. Specifically, similarly to a potential measuring device 10H illustrated in FIG. 17, it may be structured such that the coil 33 is disposed only on a bobbin 32 on the Y1 side, but the coil 33 is not disposed on a bobbin 32 on the Y2 side. Note that in the structure illustrated in FIG. 17, on the X1 side, magnets 80 are disposed so that their magnetization directions are opposite to each other along the Y direction. Further, also on the X2 side, magnets 80 are disposed so that their magnetization directions are opposite to each other along the Y direction. However, on each of the Y1 side and the Y2 side, the magnets are provided so that the same magnetic poles oppose each other in the X direction.

Figure 17:
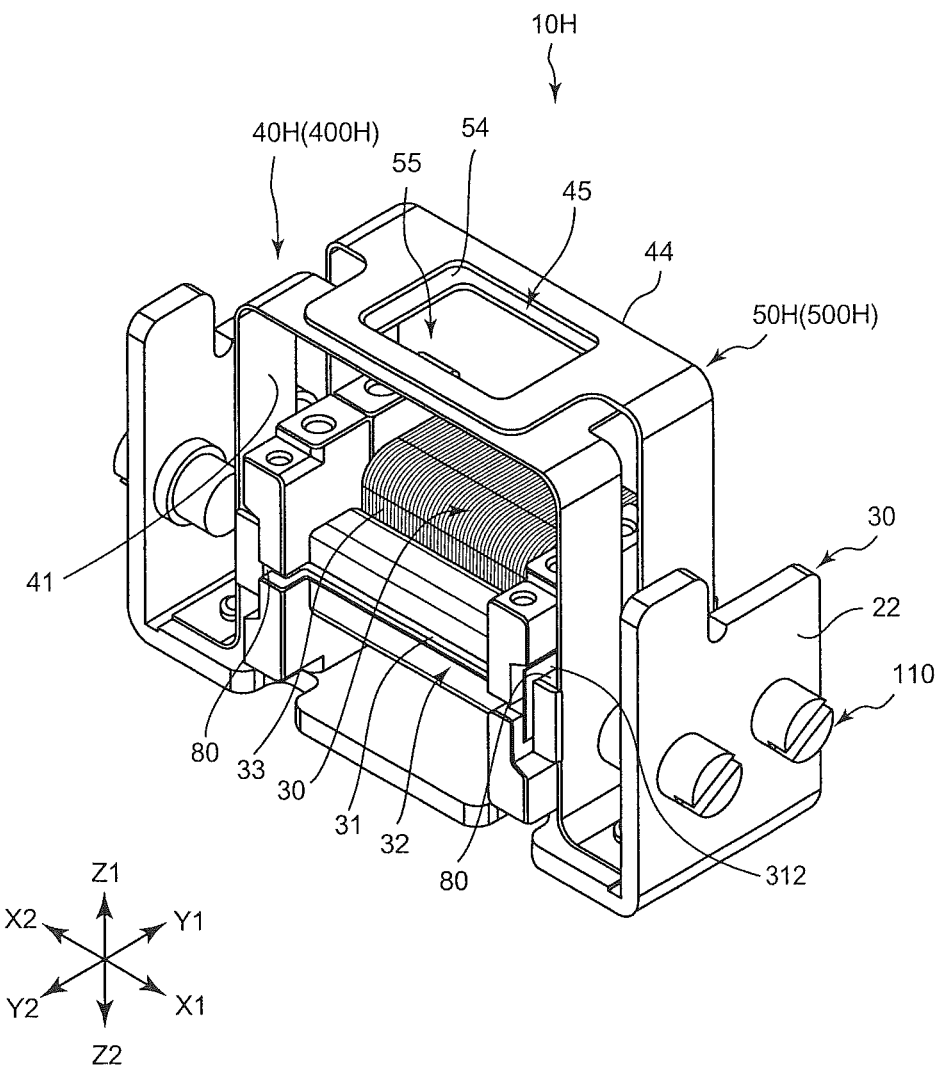
FIG. 17 is a perspective view illustrating a structure according to a modification example of the present invention in which a coil is disposed on one bobbin but a coil is not disposed on the other bobbin.

Also in such a structure illustrated in FIG. 17, by obtaining good magnetic efficiency between the coil 33 and the magnets 80 on the Y1 side, the driving force applied to a first shutter 40H and a second shutter 50H can be made large. Further, a magnet circuit can be formed between the pair of yokes 31, and a first shutter 40H and a second shutter 50H can be favorably driven in opposite directions to each other. Note that in the structure illustrated in FIG. 17, the magnets 80 located on the Y2 side may be ones larger in magnetic force than the magnets 80 located on the Y1 side, thereby balancing the driving force by magnetism in the first shutter 40H and the driving force by magnetism in the second shutter 50H. Note that the alternating current or the alternating voltage includes both one in which an alternating current component and a direct current component are overlapped and one which contains only the alternating current component.

What is claimed is:

1. A potential measuring device which measures a surface potential of a charged object in a non-contact manner with a sensor disposed to oppose the charged object, the device comprising:
    a first shutter having a first shutter part, which is disposed between the charged object and the sensor and has a first opening, and leaf spring parts extending from both ends of the first shutter part;
    a second shutter having a second shutter part, which is disposed between the charged object and the sensor and is provided with a second opening disposed at a position opposing the first opening, and leaf spring parts extending from both ends of the second shutter part;
    a coil having a yoke in which magnetic poles different from each other are formed on one end side and another end side when an electric current is conducted, and the one end side and the other end side are provided to oppose portions of the leaf spring parts; and
    a magnet provided to oppose the coil on each of the leaf spring parts of at least one of the first shutter part of the first shutter and the second shutter part of the second shutter.

2. The potential measuring device according to claim 1, wherein:
    the first shutter and the second shutter are disposed in a state of lining along a forward and backward direction orthogonal to a direction coupling the one end side and the other end side of the coil;
    in the first shutter part, a projecting portion exists to project toward the second shutter side in the forward and backward direction more than the leaf spring parts, with the first opening being provided to reach the projecting portion; and
    in the second shutter part, a projecting portion exists to project toward the first shutter side in the forward and backward direction more than the leaf spring parts, with the second opening being provided to reach the projecting portion.

3. The potential measuring device according to claim 1, wherein:
   the sensor is attached to a first base plate on a side closer to the first opening and the second opening than the coil; and
   a driving circuit for driving the coil is provided on a second base plate on a side separated farther from the first opening and the second opening than the coil.

4. The potential measuring device according to claim 1, wherein:
   the magnet is attached to a side of each of the leaf spring parts that is separated from the shutter part farther than a center side of the leaf spring part.

5. The potential measuring device according to claim 1, wherein:
   the yoke is provided along a direction coupling the one end side and the other end side of the coil; and
   a back yoke guiding a magnetic flux is provided on an opposite side of a side of the magnet that opposes the leaf spring part.

6. A potential measuring device which measures a surface potential of a charged object in a non-contact manner with a sensor disposed to oppose the charged object, the device comprising:
   a first shutter having a first shutter part, which is disposed between the charged object and the sensor and has a first opening, and leaf spring parts extending from both ends of the first shutter part;
   a second shutter having a second shutter part, which is disposed between the charged object and the sensor and is provided with a second opening disposed at a position opposing the first opening, and leaf spring parts extending from both ends of the second shutter part;
   a coil having an in-coil yoke in which magnetic poles different from each other are formed on one end side and another end side when an electric current is conducted, and the one end side and the other end side are provided to oppose portions of the leaf spring parts; and
   a magnet provided to oppose the coil on each of the leaf spring parts of at least one of the first shutter and the second shutter,
   wherein the magnetic flux of the magnet flows in one direction through the in-coil yoke and the yoke outside the coil, and by an excitation current of the coil, a coil magnetic flux is generated alternately in a forward direction and a reverse direction with respect to the magnetic flux.

\* \* \* \* \*